US011943870B2

(12) United States Patent
Kawai

(10) Patent No.: US 11,943,870 B2
(45) Date of Patent: Mar. 26, 2024

(54) COMPONENT MOUNTING LINE

(71) Applicant: FUJI CORPORATION, Chiryu (JP)

(72) Inventor: Hidetoshi Kawai, Anjo (JP)

(73) Assignee: FUJI CORPORATION, Chiryu (JP)

( * ) Notice: Subject to any disclaimer, the term of this patent is extended or adjusted under 35 U.S.C. 154(b) by 819 days.

(21) Appl. No.: 17/051,577

(22) PCT Filed: May 31, 2018

(86) PCT No.: PCT/JP2018/020935
§ 371 (c)(1),
(2) Date: Oct. 29, 2020

(87) PCT Pub. No.: WO2019/229925
PCT Pub. Date: Dec. 5, 2019

(65) Prior Publication Data
US 2021/0092885 A1    Mar. 25, 2021

(51) Int. Cl.
*H05K 13/02*    (2006.01)
(52) U.S. Cl.
CPC .................................. *H05K 13/021* (2013.01)
(58) Field of Classification Search
CPC ............. H05K 13/021; H05K 13/0419; H05K 13/0888; Y10T 29/4913; Y10T 29/5313; Y10T 29/53187
See application file for complete search history.

(56) References Cited

U.S. PATENT DOCUMENTS 10,517,201 B2 * 12/2019 Ikeyama ............ H05K 13/0419
10,561,050 B2    2/2020 Iisaka et al.
10,820,459 B2 * 10/2020 Kondo ................... H05K 13/08
10,959,360 B2 *  3/2021 Kondo ................... H05K 13/08

FOREIGN PATENT DOCUMENTS

WO    WO 2016/035145 A1    3/2016

OTHER PUBLICATIONS

International Search Report dated Aug. 28, 2018 in PCT/JP2018/020935 filed May 31, 2018, Citing documents AA and AO therein, 2 pages.

* cited by examiner

*Primary Examiner* — Donghai D Nguyen
(74) *Attorney, Agent, or Firm* — Oblon, McClelland, Maier & Neustadt, L.L.P.

(57) ABSTRACT

An automatic exchanging device moves along a front face of component mounting line in an arrangement direction of multiple component mounters to automatically exchange a feeder with respect to feeder setting section of each component mounter. A production management computer of the component mounting line or control device of each component mounter monitors an arrangement status of the feeder set in the feeder setting section of each component mounter, and when it is determined that an empty space of the feeder setting section of any one of the component mounters is equal to or larger than a predetermined value based on a monitoring result, controls an operation of the automatic exchanging device, such that an automatically exchangeable unit is set in the empty space of the feeder setting section of the component mounter.

8 Claims, 5 Drawing Sheets

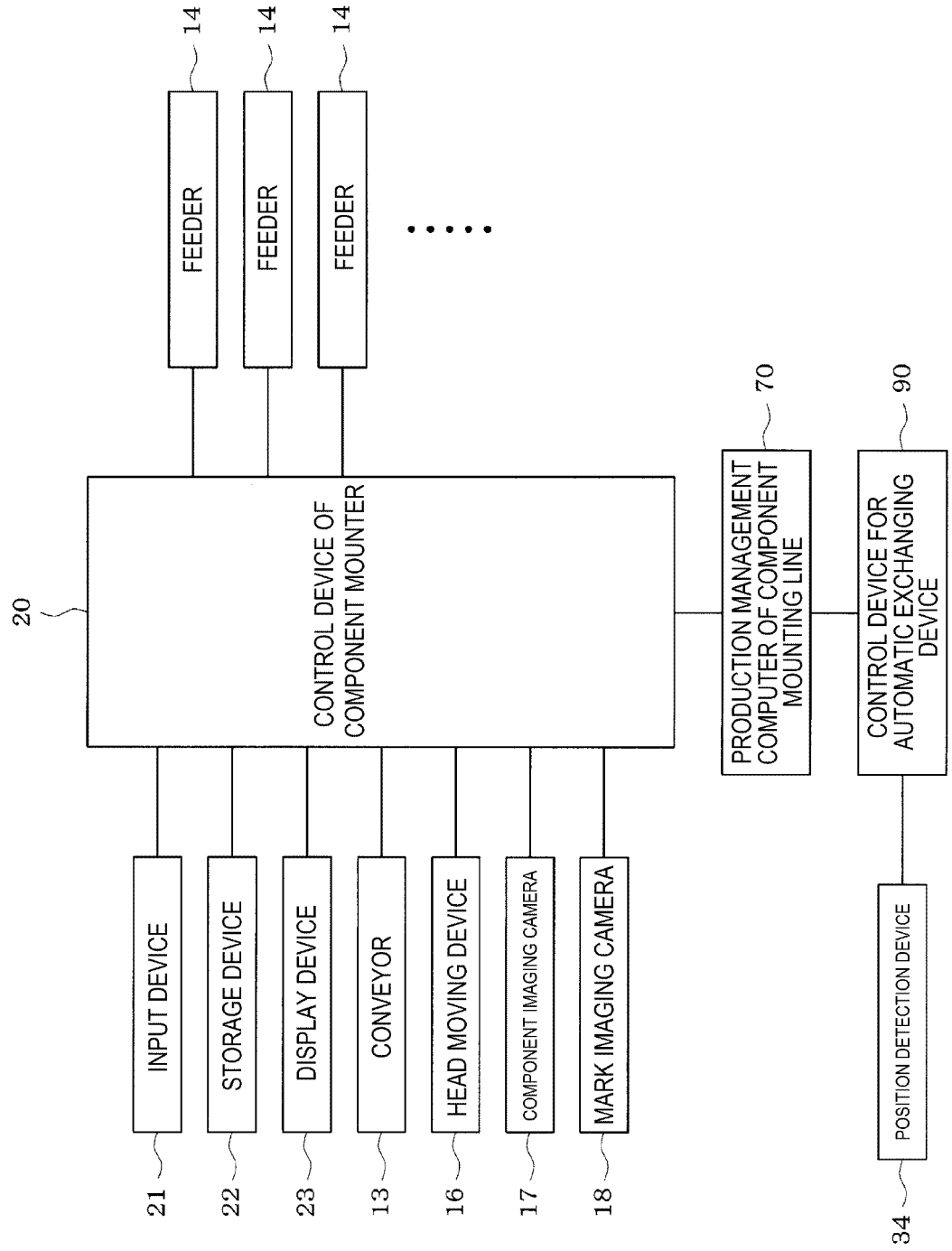

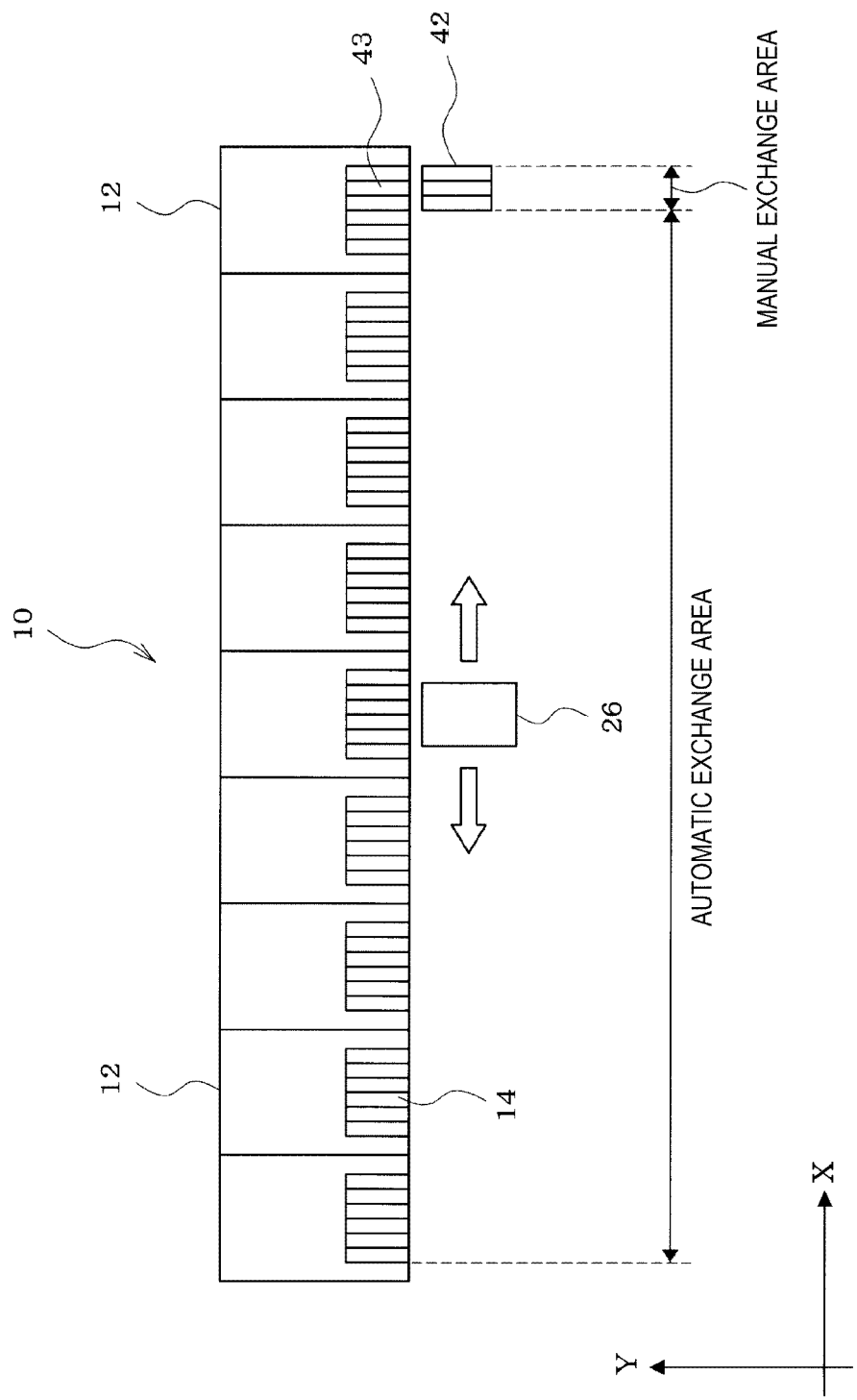

COMPONENT MOUNTING LINE

TECHNICAL FIELD

The present specification discloses a technique relating to a component mounting line including an automatic exchanging device that performs automatic exchange (set and/or removal) of feeders with respect to feeder setting sections of multiple component mounters arranged along a conveyance path of a circuit board.

BACKGROUND ART

Recently, as described in Patent Literature 1 (International Publication WO2016/035145), there is an invention in which an automatic exchanging device (exchanging robot) is installed in a movable manner on a moving lane provided along an arrangement of multiple component mounters constituting a component mounting line, and the automatic exchanging device is moved to the front of a component mounter at which an automatic exchange request is generated and automatically exchanges a feeder with respect to a feeder setting section of the component mounter.

PATENT LITERATURE

Patent Literature 1: International Publication WO2016/035145

BRIEF SUMMARY

Technical Problem

Arrangement of the feeder to be set in the feeder setting section of each component mounter of the component mounting line is optimized depending on the type or quantity of components to be mounted on the circuit board in the component mounting line. When the type or quantity of components to be mounted is small, the number of feeders to be set in the feeder setting section of each component mounter is also small, and as a result, an empty space (empty slot) of the feeder setting section increases, and a large gap penetrating the feeder setting section in a front-rear direction is generated due to the empty space. During production, since an XY-robot (head moving device) moves a mounting head at high speed at a deep inside of the feeder setting section, when the empty space of the feeder setting section increases, the large gap is generated in a front side (operator side) of a high-speed moving space of the mounting head, such that when an operator mistakenly puts his or her hand into the large gap, the hand may contact the mounting head.

As a countermeasure, it is conceivable to, on a front face side of the component mounting line, provide a light curtain (area sensor) that detects an intrusion of the operator's hand or objects to the feeder setting section of each component mounter, so as to automatically stop the XY-robot when the intrusion of the operator's hand or objects is detected. However, in this configuration, each time the automatic exchanging device automatically exchanges the feeder with respect to the feeder setting section of the component mounter during the production, the light curtain is activated to automatically stop the XY-robot, and then the production may be hindered.

Solution to Problem

In order to solve the above problems, a component mounting line in which multiple component mounters are arranged along a conveyance path of a circuit board and, in the multiple component mounters, a component supplied from a feeder, which is set in a feeder setting section of each component mounter, is mounted on the circuit board is provided; the component mounting line includes an automatic exchanging device configured to move along a front face of the component mounting line in an arrangement direction of the multiple component mounters to automatically exchange the feeder with respect to the feeder setting section of each component mounter, a feeder arrangement monitoring section configured to monitor an arrangement status of the feeder set in the feeder setting section of each component mounter, and a control device configured to control an operation of the automatic exchanging device; in which the control device controls the operation of the automatic exchanging device, when it is determined that an empty space of the feeder setting section of any one of the component mounters is equal to or larger than a predetermined value based on a monitoring result of the feeder arrangement monitoring section, such that an automatically exchangeable unit is set in the empty space of the feeder setting section of the component mounter.

With this configuration, when it is determined that the empty space of the feeder setting section of any one of the component mounters of the component mounting line is equal to or larger than the predetermined value based on the monitoring result of the feeder arrangement monitoring section, being configured to monitor the arrangement status of the feeder set in the feeder setting section of each component mounter of the component mounting line, the control device controls the operation of the automatic exchanging device such that the automatically exchangeable unit is set in the empty space of the feeder setting section of the component mounter, thereby each time the empty space, into which the operator may mistakenly put his or her hand, is created in the feeder setting section of any one of the component mounters during the production, the empty space of the feeder setting section of the component mounter can be automatically filled with the automatically exchangeable unit by the automatic exchanging device. In this case, as the automatically exchangeable unit that fills the empty space of the feeder setting section, for example, a feeder not used in the current production, a dummy feeder not supplying components (such as a feeder from which a tape reel is removed), or any unit supplying things other than components (such as suction nozzles) may be used.

BRIEF DESCRIPTION OF DRAWINGS

FIG. 4 is a block diagram schematically showing a configuration of a control system of the component mounting line with the automatic exchanging device.

FIG. 5 is a diagram describing a relationship between an automatic exchange area and the manual exchange area of the component mounting line.

DESCRIPTION OF EMBODIMENTS

Hereinafter, an embodiment disclosed in the present specification is described. First, a configuration of component mounting line 10 will be described with reference to FIGS. 1 to 4.

Component mounting line 10 is configured by arranging multiple component mounters 12 in a row along a conveyance direction (X-direction) of circuit board 11, and a solder printer (not shown) that prints solder on circuit board 11, feeder storage device 19 that stores automatically exchangeable feeder 14, and the like are installed on a board carry-in side of component mounting line 10.

Figure 2:
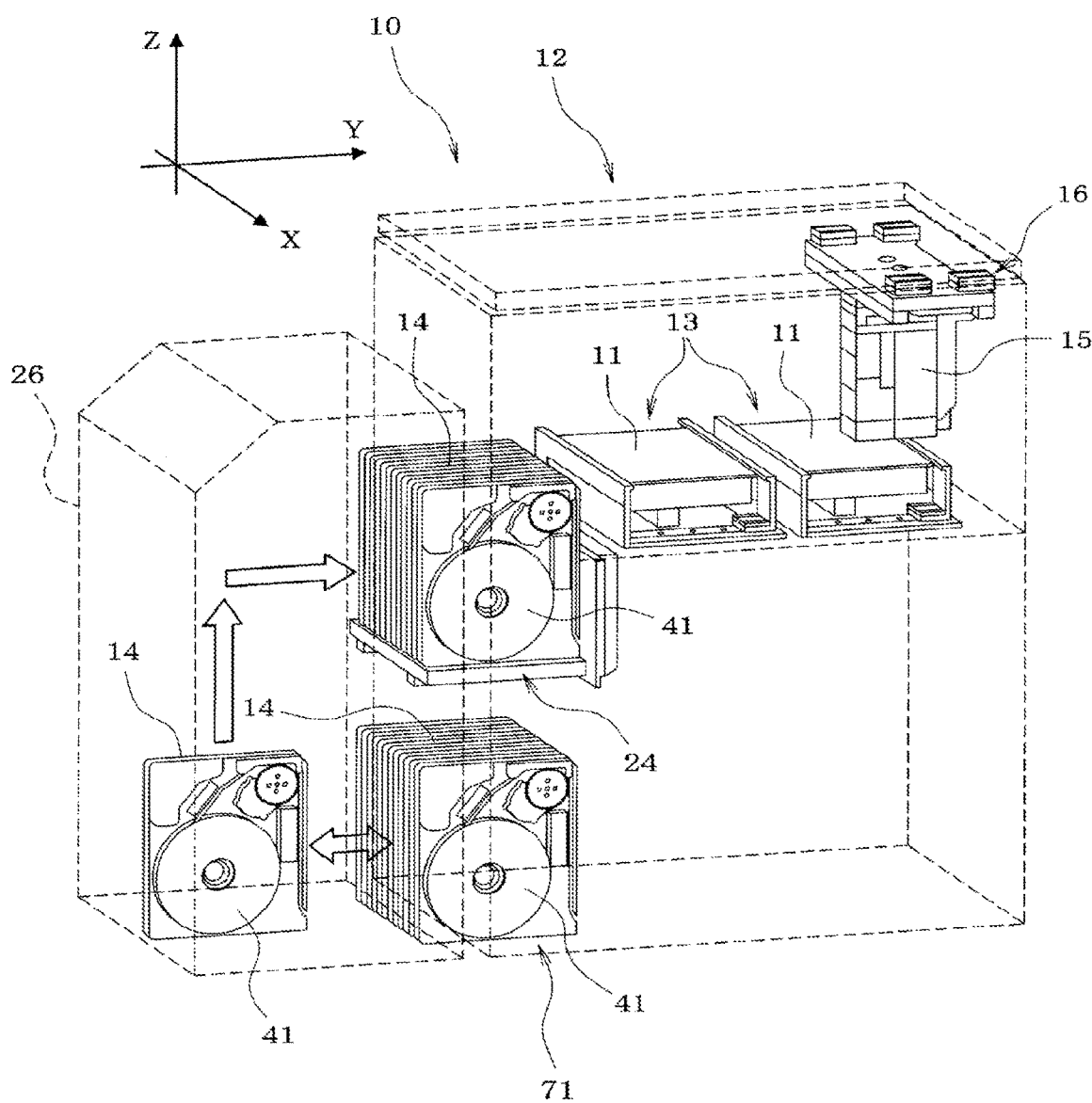
FIG. 2 is a perspective view schematically showing a configuration of an automatic exchanging device and a component mounter.

As shown in FIG. 2, each component mounter 12 is provided with two conveyors 13 that convey circuit board 11, feeder setting section 24 that sets multiple automatically exchangeable feeders 14 to be exchangeable (detachable), mounting head 15 that holds a suction nozzle (not shown) that picks up a component supplied from feeder 14 set in feeder setting section 24 and mounts the component on circuit board 11, head moving device 16 (XY-robot) that moves mounting head 15 in XY-directions (left, right, forward, and rearward directions), and component imaging camera 17 (refer to FIG. 4) that images the component picked up by the suction nozzle from below. Mark imaging camera 18 (refer to FIG. 4) that images a reference mark (not shown) of circuit board 11 is attached to head moving device 16 so as to move integrally with mounting head in the XY-directions.

In addition, as shown in FIG. 4, input device 21 such as a keyboard, a mouse, or a touch panel, storage device 22 such as a hard disk, ROM, or RAM that stores various programs or various data for control, display device 23 such as a liquid crystal display, or CRT, and the like are connected to control device 20 of component mounter 12. Control device 20 of each component mounter 12 is connected, via a network, to production management computer 70 that manages production of the entire component mounting line 10, such that the production of the entire component mounting line 10 is managed by production management computer 70.

Each component mounter 12 of component mounting line 10 conveys circuit board 11 conveyed from component mounter 12 on an upstream side to a predetermined position with conveyor 13, clamps and positions circuit board 11 with clamping mechanism (not shown), images the reference mark of circuit board 11 with mark imaging camera 18, recognizes the position of the reference mark (a reference position of circuit board 11), picks up the component supplied from feeder 14 with the suction nozzle of mounting head 15, moves the component from the pickup position to the imaging position, images the component from a lower face side with component imaging camera 17, and determines a pickup positional deviation amount of the component, and then moves mounting head 15 to correct the pickup positional deviation amount and mounts the component on circuit board 11, which is on conveyor 13, to produce a component mounting board.

Figure 1:
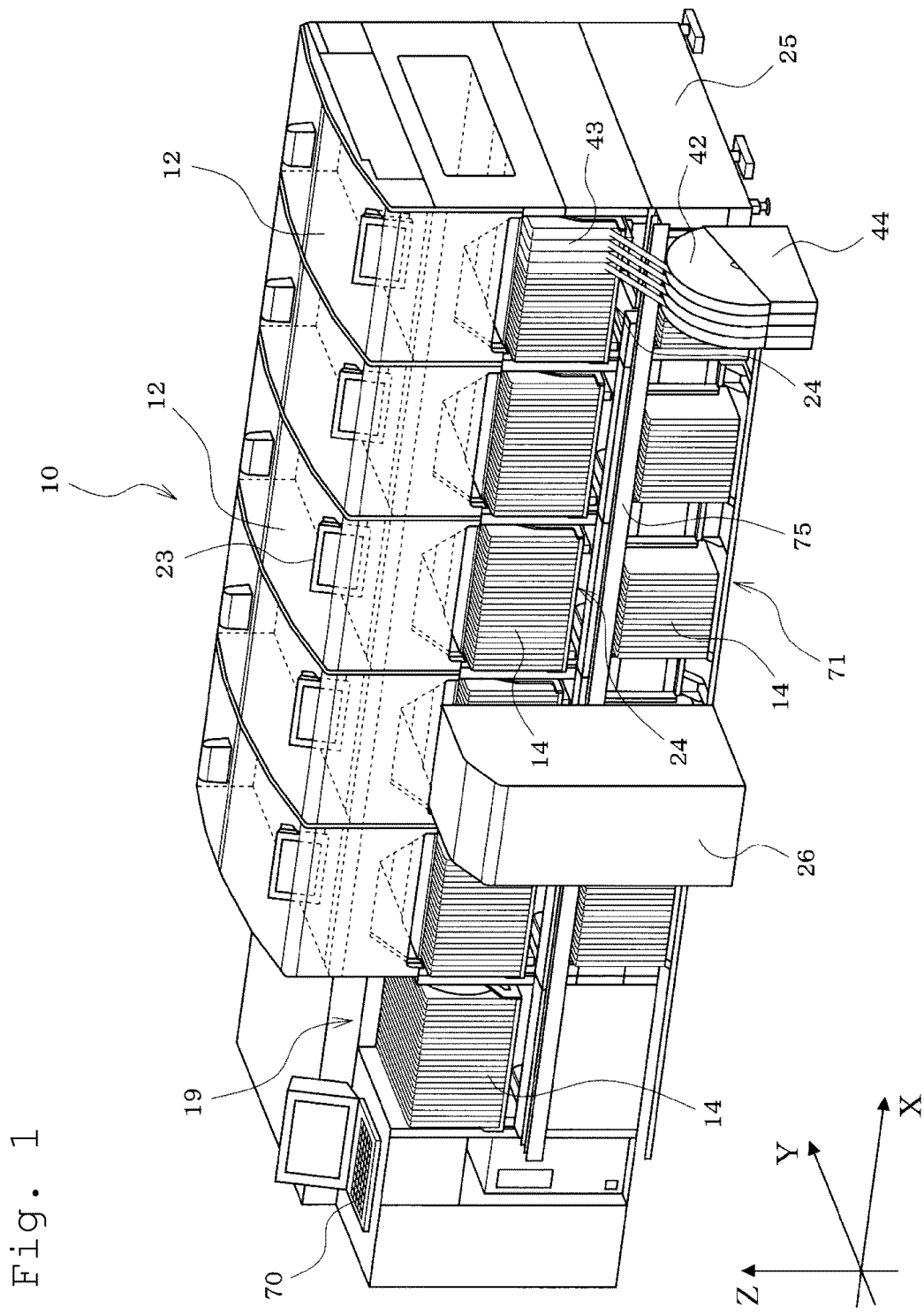
FIG. 1 is a perspective view showing an entire configuration of a component mounting line in an embodiment.

As shown in FIG. 1, automatic exchanging device 26 that performs automatic exchange (set and/or removal) of feeder 14 to feeder setting section 24 of each component mounter 12 is installed on a front face side of component mounting line 10. Below feeder setting section 24 of each component mounter 12, stock section 71 that accommodates multiple feeders 14 to be set in feeder setting section 24 is provided. Automatic exchanging device 26 is configured to, when an automatic exchange request of feeder 14 is generated in any one of multiple component mounters 12 constituting component mounting line 10, move to component mounter 12 in which the automatic exchange request is generated, take out exchange target feeder 14 from feeder setting section 24 of component mounter 12, collect feeder 14 to stock section 71, take out necessary feeder 14 from stock section 71, and set it in feeder setting section 24. Incidentally, depending on the automatic exchange request, there is a case where automatic exchanging device 26 performs only the operation of collecting feeder 14 taken out from feeder setting section 24 to stock section 71 or, in reverse, there is a case where automatic exchanging device 26 performs only the operation of setting feeder 14 taken out from stock section 71 in an empty slot of feeder setting section 24.

On the front face side of component mounting line 10, guide rail 75 that moves automatic exchanging device 26 along the arrangement of component mounters 12 in the X-direction (left-right direction) is provided so as to extend in the X-direction over the entire component mounting line 10. The board carry-in side of guide rail 75 extends to feeder storage device 19, such that automatic exchanging device 26 moves to the front face side of feeder storage device 19 and automatic exchanging device 26 takes out feeder 14 necessary for automatic exchange from feeder storage device 19 or returns used feeder 14 to feeder storage device 19.

Position detection device 34 (refer to FIG. 4) that detects position of automatic exchanging device 26 with respect to component mounting line 10 is provided in automatic exchanging device 26. When the automatic exchange request is generated in any one of component mounters 12, control device 90 of automatic exchanging device 26 causes automatic exchanging device 26 to move to component mounter 12 in which the automatic exchange request is generated to perform the automatic exchange of feeder 14, while detecting the position of automatic exchanging device 26 based on a detection signal of position detection device 34.

Incidentally, in addition to the automatic exchange of feeder 14, although not shown, automatic exchanging device 26 can also automatically exchange a cassette-type nozzle exchange unit accommodating the suction nozzle for exchange, a cassette-type calibration component supply unit supplying a calibration component, and the like with respect to feeder setting section 24.

Production management computer 70 (control device) monitors whether the automatic exchange request is generated in any one of multiple component mounters 12 constituting component mounting line 10 during the production, and when the automatic exchange request is generated in any one of component mounters 12, transmits the information to control device 90 of automatic exchanging device 26, such that automatic exchanging device 26 is moved to the front of component mounter 12 in which the automatic exchange request is generated. Alternatively, control device 90 of automatic exchanging device 26 may directly acquire the information of component mounter 12 in which the automatic exchange request is generated from component mounter 12 via the network, and automatic exchanging device 26 may move to the front of component mounter 12.

Figure 3:
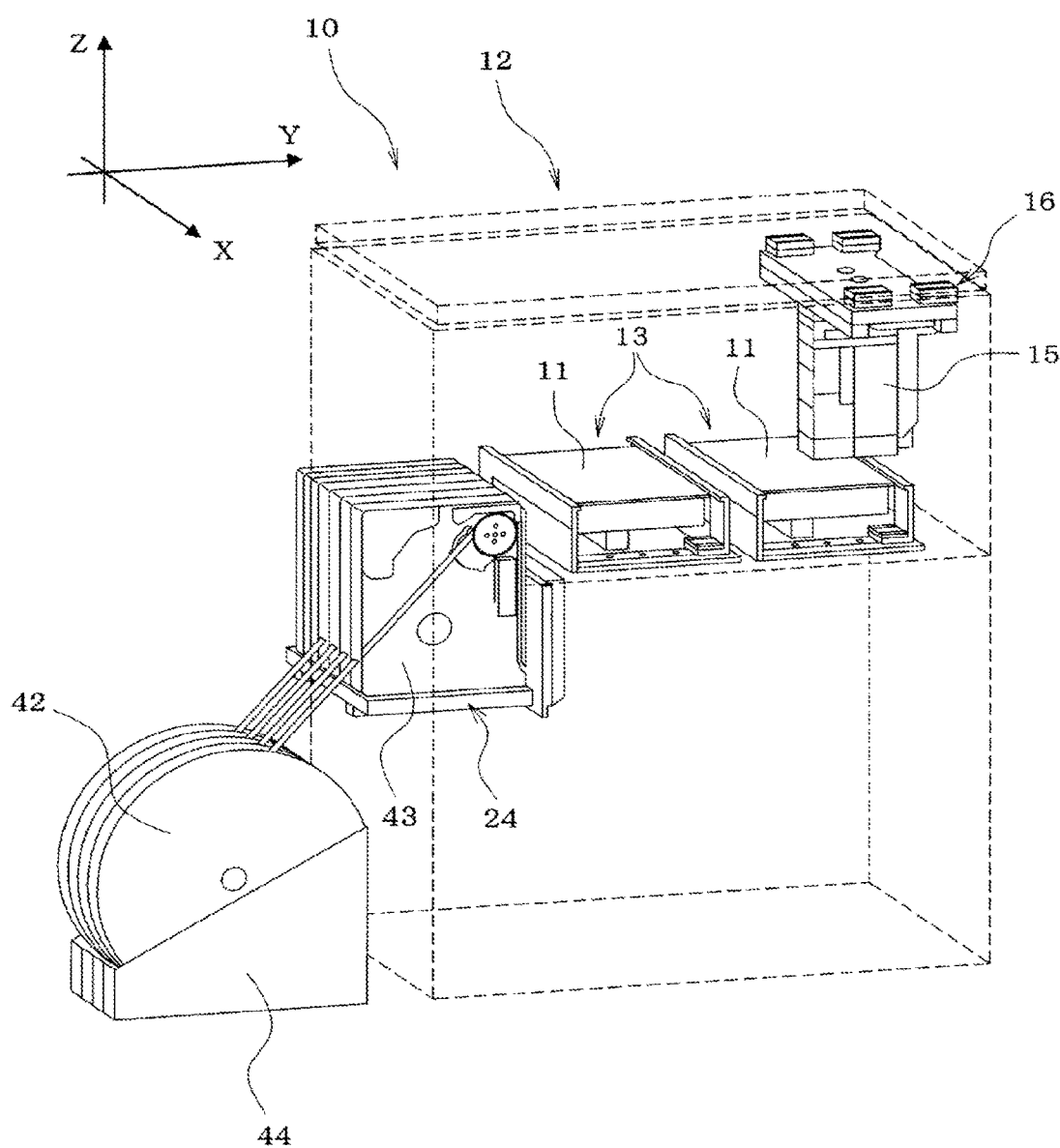
FIG. 3 is a perspective view schematically showing a configuration of a component mounter to be installed in a manual exchange area.

Incidentally, feeder 14 automatically exchanged by automatic exchanging device 26 is, as shown in FIG. 2, a reel accommodation-type feeder (cassette-type feeder) that accommodates tape reel 41 therein, but depending on the type and size of the component to be mounted on circuit board 11, as shown in FIG. 3, since the size of tape reel 42 around which the component supply tape is wound is larger than the size of feeder 43 set in feeder setting section 24 and tape reel 42 cannot be accommodated in feeder 43, in some cases, it is necessary to use reel holder-type feeder 43 that holds tape reel 42 in reel holder 44 provided outside feeder 43. Since such reel holder-type feeder 43 cannot be automatically exchanged by automatic exchanging device 26, it is necessary for the operator to exchange manually.

Therefore, in component mounting line 10 of the present embodiment, as shown in FIG. 5, the automatic exchange area in which the exchange operation of feeder 14 with respect to feeder setting section 24 of component mounter 12 is automatically performed by automatic exchanging device 26 and the manual exchange area in which the exchange operation of feeder 43 with respect to feeder setting section 24 of component mounter 12 is manually performed by the operator are provided. Automatic exchanging device 26 is configured to move only in the automatic exchange area and not in the manual exchange area.

As in the present embodiment, when only one automatic exchanging device 26 is provided in component mounting line 10, the manual exchange area is needed to be provided at an end of component mounting line 10 (most upstream side or most downstream side). When two or more automatic exchanging devices 26 are provided in component mounting line 10, the manual exchange area may be provided in the middle of component mounting line 10. In short, the manual exchange area may be provided adjacent to an end of the automatic exchange area where one automatic exchanging device 26 moves.

In general, the components to be mounted on circuit board 11 tend to be mounted in order from a small-sized component, and finally a large-sized component is mounted. The small-sized component can be supplied by reel accommodation-type feeder 14 that can be automatically exchanged by automatic exchanging device 26, but the large-sized component cannot be supplied by reel accommodation-type feeder 14, such that in some cases, it is necessary to use reel holder-type feeder 43 that holds large-sized tape reel 42 in reel holder 44 provided outside. In consideration of this point, in the present embodiment, the manual exchange area is provided at the most downstream side of component mounting line 10.

Here, a size of the manual exchange area need only be set depending on the number of reel holder-type feeders 43 necessary for the production, one or two or more component mounters 12 at the most downstream side of component mounting line 10 may be entirely set as the manual exchange area, or only a part of a downstream side of one component mounter 12 on the most downstream side of component mounting line 10 may be set as the manual exchange area. In this case, with respect to one component mounter 12 on the most downstream side of component mounting line 10, an upstream side is the automatic exchange area, and the downstream side is the manual exchange area. Incidentally, the feeder manually exchanged by the operator in the manual exchange area may be only reel holder-type feeder 43, or in addition to reel holder-type feeder 43, a small number of automatically exchangeable reel accommodation-type feeder 14 may be included. On the other hand, the feeder automatically exchanged by automatic exchanging device 26 in the automatic exchange area is only reel accommodation-type feeder 14 that accommodates tape reel 41 therein.

In the present embodiment, in a step of optimizing the feeder arrangement of component mounting line 10, the feeder arrangement of component mounting line 10 is optimized, such that only reel accommodation-type feeder 14 that can be automatically exchanged by automatic exchanging device 26 is arranged in the automatic exchange area, and reel holder-type feeder 43 that cannot be automatically exchanged by automatic exchanging device 26 is arranged only in the manual exchange area.

Furthermore, production management computer 70 of component mounting line 10 or control device 20 of each component mounter 12 functions as the feeder arrangement monitoring section that monitors the arrangement status of automatically exchangeable feeder 14 set in feeder setting section 24 of each component mounter 12 and, when it is determined that the empty space (empty slot) of feeder setting section 24 of any one of component mounters 12 is equal to or larger than a predetermined value, with a value of which creating the empty space into which the operator may mistakenly put his or her hand, based on a monitoring result, thereafter such information is transmitted to cause control device 90 of automatic exchanging device 26 to set the automatically exchangeable unit in the empty space of feeder setting section 24 of component mounter 12. Thus, automatic exchanging device 26 sets the automatically exchangeable unit in the empty space of feeder setting section 24 of component mounter 12.

Here, as the automatically exchangeable unit that is set in the empty space of feeder setting section 24, for example, feeder 14 not used in the current production (feeder 14 used in a next production or in a subsequent production), a dummy feeder not supplying components (such as feeder 14 from which tape reel 41 is removed or a feeder from which a built-in electrical component such as tape reel 41 or a tape feeding device is removed), or any unit supplying things other than components (such as the suction nozzles or the calibration components) may be used. In short, any unit may be used as long as a unit that can be automatically exchanged with respect to the empty space of feeder setting section 24 by automatic exchanging device 26. Automatically exchangeable unit to be set in the empty space of feeder setting section 24 may be accommodated in feeder storage device 19 or stock section 71 of each component mounter 12 in advance.

As a method for monitoring the arrangement status of feeder 14 set in feeder setting section 24 of each component mounter 12, production management computer 70 or control device 20 of each component mounter 12 may detect presence or absence of feeder 14 of each slot of feeder setting section 24 of each component mounter 12, and monitor the arrangement status of feeder 14 of each component mounter 12 based on the detection result. Alternatively, production management computer 70 or control device 20 of each component mounter 12 may monitor the arrangement status of feeder 14 of each component mounter 12 based on feeder arrangement data of each component mounter 12 designated in the production job (production program).

Further, production management computer 70 or control device 20 of each component mounter 12 monitors set status of the automatically exchangeable unit set in the empty space of feeder setting section 24 of each component mounter 12, stops the production of component mounter 12 when it is determined the automatically exchangeable unit is mistakenly removed by the operator, and restarts the production of component mounter 12 after setting the automatically exchangeable unit in the empty space of feeder setting section 24 of component mounter 12. As a result, the safety of component mounter 12 can be enhanced.

According to the present embodiment described above, since production management computer 70 of component mounting line 10 or control device 20 of each component mounter 12 monitors the arrangement status of feeder 14 set in feeder setting section 24 of each component mounter 12 and controls the operation of automatic exchanging device 26, when it is determined that the empty space of feeder setting section 24 of any one of component mounters 12 is equal to or larger than the predetermined value, which is a value at which the operator may mistakenly put his or hand into the empty space, based on a monitoring result, such that the automatically exchangeable unit is set in the empty space of feeder setting section 24 of component mounter 12, each time the empty space into which the operator may mistakenly put his or her hand is generated in feeder setting section 24 of any one of component mounters 12 during the production, the empty space of feeder setting section 24 of component mounter 12 can be automatically filled with the automatically exchangeable unit by automatic exchanging device 26. In this manner, it is possible to reliably prevent the operator from mistakenly putting his or her hand in the empty space of feeder setting section 24 of component mounter 12 and to enhance the safety of component mounting line 10.

Moreover, in the present embodiment, since component mounting line 10 is provided with the manual exchange area in which the exchange operation of feeder 43 with respect to feeder setting section 24 of component mounter 12 is manually performed by the operator, the large-sized component or the like that cannot be supplied by reel accommodation-type feeder 14, which is automatically exchanged by automatic exchanging device 26, can be supplied by reel holder-type feeder 43, which is set in the manual exchange area, to component mounter 12. In this manner, a component mounting board mounting the large-sized component or the like that cannot be supplied by reel accommodation-type feeder 14, which is automatically exchanged by automatic exchanging device 26, can be produced in component mounting line 10 with automatic exchanging device 26.

It is needless to say that the present disclosure is not limited to the configuration of the embodiment, and can be implemented by various modifications within a range not departing from the gist, such as changing the configuration of component mounting line 10, changing the configuration of each component mounter 12, or changing the configuration of automatic exchanging device 26.

REFERENCE SIGNS LIST

10 . . . Component mounting line, 11 . . . Circuit board, 12 . . . Component mounter, 14 . . . Reel accommodation-type feeder, 15 . . . Mounting head, 19 . . . Feeder storage device, 20 . . . Control device of the component mounter (feeder arrangement monitoring section), 24 . . . Feeder setting section, 26 . . . Automatic exchanging device, 41, 42 . . . Tape reel, 43 . . . Reel holder-type feeder, 44 . . . Reel holder, 70 . . . Production management computer (feeder arrangement monitoring section, control device), 71 . . . Stock section, 90 . . . Control device of the automatic exchanging device

The invention claimed is:

1. A component mounting line in which multiple component mounters are arranged along a conveyance path of a circuit board and, in the multiple component mounters, a component supplied from a feeder, which is set in a feeder setting section of each component mounter, is mounted on the circuit board, the component mounting line comprising:
an automatic exchanging device configured to move along a front face of the component mounting line in an arrangement direction of the multiple component mounters to automatically exchange the feeder with respect to the feeder setting section of each component mounter;
a feeder arrangement monitoring section configured to monitor an arrangement status of the feeder set in the feeder setting section of each component mounter; and
a control device configured to control an operation of the automatic exchanging device,
wherein when the control device is determined that an empty space of the feeder setting section of any one of the component mounters is equal to or larger than a predetermined value based on a monitoring result of the feeder arrangement monitoring section, the control device controls the operation of the automatic exchanging device such that an automatically exchangeable unit is set in the empty space of the feeder setting section of the respective component mounter.

2. The component mounting line according to claim 1, wherein the automatically exchangeable unit is a feeder that is not used in a current production or a dummy feeder that does not supply a component.

3. The component mounting line according to claim 1,
wherein, in the component mounting line, a manual exchange area in which an operator manually performs an exchange operation of the feeder with respect to the feeder setting section of the component mounter is provided, and
the automatic exchanging device is configured not to move to the manual exchange area.

4. The component mounting line according to claim 3, wherein the manual exchange area is provided at a most downstream side of the component mounting line.

5. The component mounting line according to claim 3, wherein a feeder manually exchanged by the operator in the manual exchange area is the feeder that cannot be automatically exchanged by the automatic exchanging device.

6. The component mounting line according to claim 3, wherein an arrangement of the feeder in the feeder setting section of each component mounter constituting the component mounting line is optimized, such that only a feeder that can be automatically exchanged by the automatic exchanging device is arranged in an automatic exchange area where the automatic exchanging device moves, and a feeder that cannot be automatically exchanged by the automatic exchanging device is arranged only in the manual exchange area.

7. The component mounting line according to claim 3,
wherein a feeder automatically exchanged by the automatic exchanging device is a reel accommodation-type feeder that accommodates a tape reel therein, and
a feeder manually exchanged by the operator in the manual exchange area is a reel holder-type feeder that holds the tape reel in a reel holder provided outside thereof.

8. The component mounting line according to claim 1, wherein the control device stops production of the component mounter, when the control device is determined that the automatically exchangeable unit set in the empty space of the feeder setting section of the component mounter is mistakenly removed by an operator, and restarts the production of the component mounter after the automatically exchangeable unit is set in the empty space of the feeder setting section of the component mounter.

\* \* \* \* \*